United States Patent [19]

Wilson

[11] 4,291,393
[45] Sep. 22, 1981

[54] ACTIVE REFRESH CIRCUIT FOR DYNAMIC MOS CIRCUITS

[75] Inventor: Dennis R. Wilson, Boise, Id.

[73] Assignee: Mostek Corporation, Carrollton, Tex.

[21] Appl. No.: 120,268

[22] Filed: Feb. 11, 1980

[51] Int. Cl.³ ............................................. G11C 11/40
[52] U.S. Cl. ................................ 365/203; 307/238.3; 365/222
[58] Field of Search ....................... 365/202, 203, 222; 307/238

[56] References Cited

U.S. PATENT DOCUMENTS

| 3,942,162 | 3/1976 | Buchanan | 365/203 |
| 4,028,557 | 6/1977 | Wilson | 307/362 |
| 4,061,999 | 12/1977 | Proebsting | 365/202 |
| 4,091,360 | 5/1978 | Lynch | 365/203 |

Primary Examiner—Terrell W. Fears

[57] ABSTRACT

Circuitry for automatically and selectively refreshing a dynamic node to a desired logic level. Nodes at ground potential are left at ground while nodes at an intermediate level are brought up to a supply voltage level. In a preferred use the dynamic node is a digit line in a random access memory. The circuitry includes a first transistor connected between the drain supply and a digit line having a gate connected to the source of a second transistor. The drain of the second transistor is connected to a clocked source of potential at least one threshold above the drain supply. The gate of the second transistor is precharged to a potential near the drain supply voltage preferably concurrent with precharging of digit lines in the memory proper. A third transistor is connected between the gate of the second transistor and the digit line and has a gate connected to a clocked source of a reference potential between a digit line precharge level and the level of one threshold above ground. After the state of a memory cell is read out by a sense amplifier, the reference potential is applied to the gate of the third transistor to discharge the gate of the second transistor in the event that the digit line is at a low voltage. If the cell read out on the digit line was at a high potential the gate of the second transistor remains charged so that when a potential exceeding the drain voltage by at least one threshold is applied to the drain of the second transistor it is coupled through to the gate of the first transistor which in turn pulls the digit line potential to the drain supply voltage.

48 Claims, 4 Drawing Figures

ACTIVE REFRESH CIRCUIT FOR DYNAMIC MOS CIRCUITS

BACKGROUND OF THE INVENTION

The present invention relates to integrated circuit MOSFET dynamic circuits and more particularly, relates to an active refresh circuit for use with such circuits.

A reference which teaches the concept of MOSFET dynamic circuitry in the form of a random access memory is U.S. Pat. No. 4,061,999 issued to Proebsting, et al. on Dec. 6, 1977. This patent which is assigned to the assignee of the present invention is hereby incorporated by reference in its entirety. In these dynamic random access memories a plurality of capacitive memory cells are coupled to a plurality of digit lines arranged in pairs of true and complement digit lines. Dynamic MOS memories are characterized by the use of capacitive storage cells. The memory of the Proebsting patent is also distinguished by the fact that during the reading of information from the memory, the sense amplifiers do not provide a direct path from the positive voltage supply, $V_{DD}$, to ground and thereby consume considerably less power than earlier devices. In the above referenced patent, circuitry is provided for precharging the digit lines to the full drain supply voltage so that upon reading of information from the memory the high level cells are automatically refreshed to a potential near the drain supply voltage. It would be desirable to positively or actively pull the digit line which is at a high level after reading up to the full drain supply voltage for best refreshing of the high level cells.

Early circuitry for actively refreshing digit cells to the drain supply potential required cross-coupling between the true digit and complementary digit lines, greatly complicating the layouts of the overall memory chip. It is of course quite apparent that the simplest circuit arrangement available allows the most compact layout which is particularly important in the large memory devices. It is therefore desireable that an active pull up circuit be provided which may be connected at any point along a digit line and need not be cross-coupled to the opposite digit line for proper operation.

The active refresh circuitry taught in U.S. Pat. No. 4,028,557 issued to the present applicant on June 7, 1977, avoids the cross-coupling problems of earlier circuitry. However, the circuit in that patent also provides a DC path from the $V_{DD}$ supply to ground on the low level digit line for a period of time after sensing. For complete dynamic operation this DC path should be avoided at all times.

SUMMARY OF THE INVENTION

Accordingly, an object of the present invention is to provide an improved active refresh circuit for use with MOSFET dynamic circuitry including random access memories.

Another object of the present invention is to provide an active refresh circuit which, when used for dynamic random access memories, requires coupling only to the digit line which it refreshes.

Another object of the present invention is to provide an active refresh circuit which never provides a DC current path from the power supply to ground.

Yet another object of the present invention is to provide an active refresh circuit for dynamic circuitry which allows refreshing of a dynamic node to the full drain supply voltage.

An active refresh circuit according to the present invention comprises a first transistor connected between a drain supply voltage source and a dynamic node, a second transistor having a source connected to a gate of the first transistor, a third transistor having a source connected to the dynamic node and a drain connected to the gate of the second transistor, and control means for precharging the second transistor gate to a potential near the drain supply voltage, then, after the state of the dynamic node has been established, applying a reference potential to the third transistor gate, and then applying a potential near the drain supply voltage to the drain of the second transistor. The circuitry functions to automatically refresh the dynamic node to a high potential when the dynamic node is above the reference potential. If the dynamic node is at ground potential, the refresh circuit is inactive and does not provide a path from the drain supply to ground.

BRIEF DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
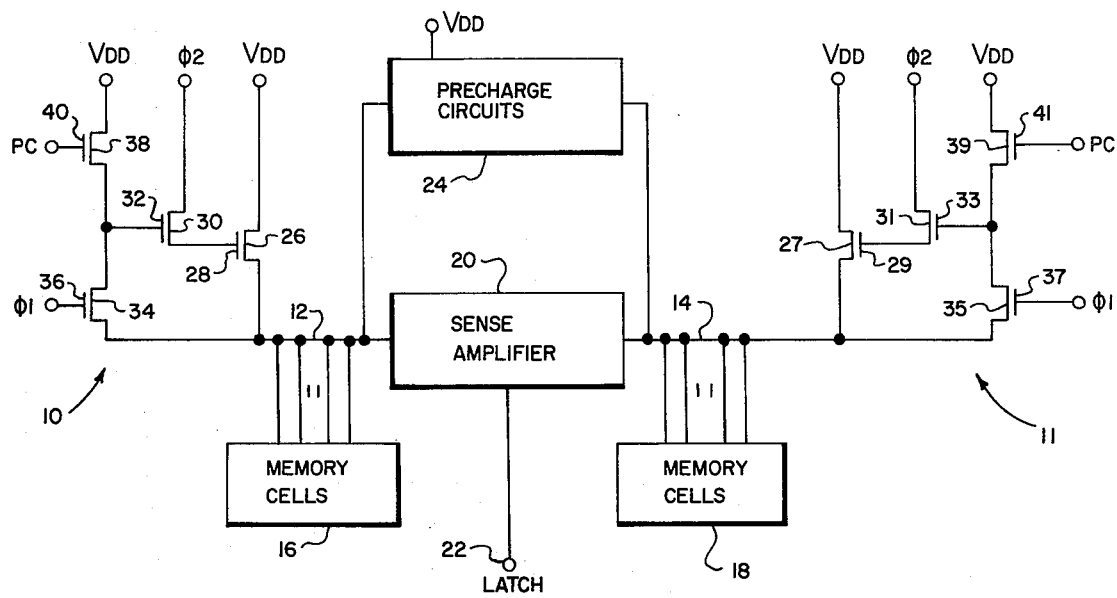
FIG. 1 is a schematic illustration of two active refresh circuits according to the present invention connected to a portion of a MOSFET dynamic random access memory illustrated in block diagram form.

With reference now to FIG. 1, circuitry comprising two active refresh circuits 10 and 11 according to the present invention is illustrated connected to true and complementary digit lines forming a single column of a MOSFET dynamic randon access memory according to the above referenced U.S. Pat. No. 4,061,999. A true digit line 12 corresponds to the line labeled $DL_1$ while a complementary digit line 14 corresponds to the line labeled $\overline{DL_1}$ in the above referenced patent. The memory cells 16 and 18 correspond to the various memory cells illustrated in the patent including the dummy cell provided on each digit line. A sense amplifier 20 is provided connected to the digit lines 12 and 14 and is of the dynamic variety preferrably identical to that illustrated in that patent. A latch input 22 is provided to sense amplifier 20 for activating the amplifier to read out the state of a memory cell addressed for that purpose. Precharge circuits 24 are provided for applying an initial reference potential, generally the full drain supply potential, to the digit lines prior to activation of sense amplifier 20. The precharge circuits 24 are preferably similar to those shown in the above referenced patent. Circuitry for providing clock potentials exceeding the drain supply potential by at least one threshold are taught in that patent, for example in FIG. 2, for allowing precharging of the digit lines to the full drain supply potential and such circuitry is also employed in the present invention for providing clocking potentials greater than the drain supply level.

As taught in the Proebsting patent, the precharge circuits 24 are capable of precharging digit lines 12 and 14 to the full drain supply potential, $V_{DD}$. When a high level is written into one of the memory cells attached to lines 12 or 14, that cell is normally charged to one threshold below drain supply potential. However, with time, that potential slowly decreases to some extent. Therefore, upon reading of a particular cell storing a high level it will be to some extent lower than the potential on the particular digit line 12 or 14 to which it is connected. For various other reasons in the reading cycle the potential on the digit line will be somewhat below the $V_{DD}$ potential when the reading cycle is complete. In the Proebsting patent refreshing of a cell occurs simultaneously with the reading of that cell so that if a high level cell is read out it is refreshed to the potential on the particular digit line 12 or 14 which is present when the reading is complete or to the $V_{DD}$ potential less one threshold, whichever is lower. For best operation it is preferred to actively pull the high digit line to the $V_{DD}$ level after reading, to insure best refresh.

The description of the active refresh circuits 10 and 11, according to the present invention will be made with respect to the circuit 10 connected to the digit line 12 although the circuit 11 connected to line 14 is identical. A first MOS transistor 26 has a source connected to the digit line 12 and a drain connected to the positive voltage supply $V_{DD}$. Transistor 26 has a gate 28 for controlling the refreshing of digit line 12 from the $V_{DD}$ supply. A second MOS transistor 30 has a source connected to the gate 28 and a drain connected to a clocked reference voltage signal designated Φ2. The transistor 30 has a gate 32 which, in the refresh circuit 10, also forms a floating precharge node. A third transistor 34 has a source connected to the digit line 12 and a drain connected to the gate 32. Transistor 34 has a gate 36 connected to a second clocked reference signal designated Φ1. A fourth MOS transistor 38 has a source connected to the gate 32 and a drain connected to the positive voltage supply $V_{DD}$. Transistor 38 has a gate 40 connected to a source of a third clocked signal designated PC, for precharge. The refresh circuit 11 connected to the digit line 14 is identical to the circuit 10 and the various parts thereof carry designation numbers which differ by only one digit from the numbers applied to circuit 10.

Operation of the refresh circuits of FIG. 1 will be described with reference to the FIG. 2 timing diagram. The first step in the preferred method of operation of the circuit is to precharge the gate 32 to a voltage preferrably at or within one threshold of the drain supply voltage $V_{DD}$. This is accomplished by providing a precharge, PC, signal as indicated by the plot 42 of voltage versus time designated PC in FIG. 2. At the beginning of the cycle this voltage is at a level preferrably equal to or above the drain supply voltage plus one threshold, $V_{DD}+V_T$. With this voltage applied to gate 40 transistor 38 couples the full $V_{DD}$ supply voltage to the precharge node or gate 32. When node 32 and digit lines 12 and 14 are appropriately precharged the PC signal returns to ground potential at event 44, isolating node 32.

Figure 2:
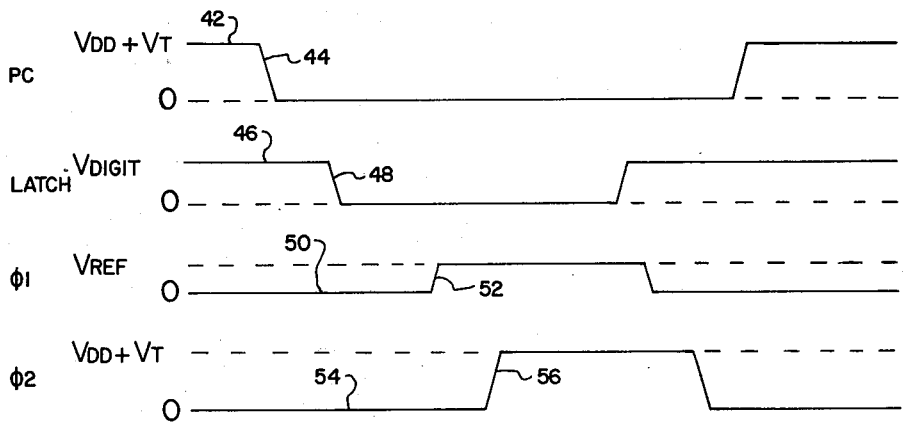
FIG. 2 is a timing diagram illustrating the operation of the circuitry of FIG. 1.

The second plot 46 of voltage versus time in FIG. 2 is designated LATCH and corresponds to the signal applied to the latch input 22 of sense amplifier 20. The LATCH signal generally begins the cycle at a voltage level corresponding to the precharge voltage level of the digit lines designated $V_{DIGIT}$. Generally, $V_{DIGIT}$ is desirably equal to $V_{DD}$, but in many circuits it is one threshold lower than the drain supply level and in other it is about half the drain supply level. In any case, the sense amplifier 20 is activated when the latch signal is pulled down at event 48 generally at a controlled rate to the zero voltage level. When this occurs, one of the digit lines 12 or 14 is pulled to ground while the other remains essentially at the precharged level. For purposes of the description it is assumed that the digit line 12 remains high and the digit line 14 is pulled to ground. While in this preferred form the precharge signal, PC, is brought to ground before the latch signal it will be apparent that this is not essential insofar as gate 40 of transistor 38 is concerned and this order could be reversed.

In any case, after the gate 32 has been precharged and then allowed to float and the digit lines 12 and 14 have reached their voltage levels occurring after reading, the reference signal Φ1 indicated by the plot 50 in FIG. 2 is raised to a reference voltage level at the occurrence 52. The level $V_{REF}$ does not need to be any particular single voltage but needs to be greater than one threshold above ground and less than the precharge voltage level, $V_{DIGIT}$ plus one threshold. In most cases a suitable level would be on the order of two thresholds above ground which can be easily generated on the chip. When the signal Φ1 is thus raised to the $V_{REF}$ level the precharge node 32 is either unaffected or discharged to ground dependent upon the voltage on the particular digit line. In this example, digit line 12 was presumed to have remained at a high level such as $V_{DD}$ and thus is higher than the signal on gate 36 so that no discharging of node 32 occurs. With reference to node 33 it will be seen that for refresh circuit 11 the precharge node will discharge to ground since digit line 14 is at a zero voltage level when digit line 12 is at a high level.

The final step in the refresh cycle occurs when the signal Φ2 indicated by the curve 54 in FIG. 2 is raised to a high voltage level, preferably at least $V_{DD}+V_T$, as indicated by the event 56. Since for refresh circuit 10 the precharge node 32 was at a potential at or near $V_{DD}$ at the time Φ2 went to the high level, the Φ2 signal is coupled through to gate 28 of transistor 26. Gate 32 is floating at this point and capacitive coupling between the channel of transistor 30 and gate 32 bootstraps the potential on gate 32 well above the drain supply voltage. As a result of this bootstrapping the full Φ2 signal potential which is preferably at least one threshold about the drain supply voltage is applied to gate 28 of transistor 26. Transistor 26 therefore refreshes the digit line 12 to the full $V_{DD}$ level. In those applications where the digit lines are designed for precharging to only $V_{DD}$ less one threshold, the Φ2 level need only reach the $V_{DD}$ level.

While transistor 26 is turned on to refresh digit line 12, there is no path to ground from line 12 so that there is no DC power dissipation. On the other hand, while line 14 is held at ground by sense amplifier 20, transistor 27 does not turn on because the precharge node, or gate, 33 has been discharged to ground through transistor 35 so that the Φ2 signal cannot reach gate 29 to turn on transistor 27. Since transistor 27 does not turn on there is no DC power dissipation in the refresh circuit 11 connected to the low level digit line 14.

While two of the refresh circuits are employed for each of the split digit lines such as lines 12 and 14, it is apparent that the operation of each refresh circuit 10 and 11 is independent of the other. The operation of each pair will obviously be complementary in each case, but this is due to the fact that the states of the digit lines 12 and 14 are always complementary to each other during the read cycle. There is no requirement of any direct connection of the refresh circuits 10 and 11 to both digit lines for proper operation.

As noted above, the precharge nodes 32 and 33 are initially raised to a potential near the drain supply level $V_{DD}$. It is preferable that the nodes be precharged to the full drain supply voltage $V_{DD}$. This may be accomplished by providing a precharge, PC, signal at a level of at least $V_{DD}$ plus one threshold. A bootstrapped clock generator circuit such as that illustrated in FIG. 2 of the above referenced patent U.S. Pat. No. 4,061,999 is preferred for this purpose although other similar circuits would also be suitable. A similar arrangement is preferably provided for producing the Φ2 reference signal where it is required to couple the full $V_{DD}$ supply level to the digit lines 12 and 14. With the bootstrapping of gate 32 produced when the Φ2 signal goes high, the circuitry can be designed to function properly even if the PC, precharge, signal is only at the drain supply voltage so that the precharge level of gates 32, 33 is one threshold below $V_{DD}$.

Figure 3:
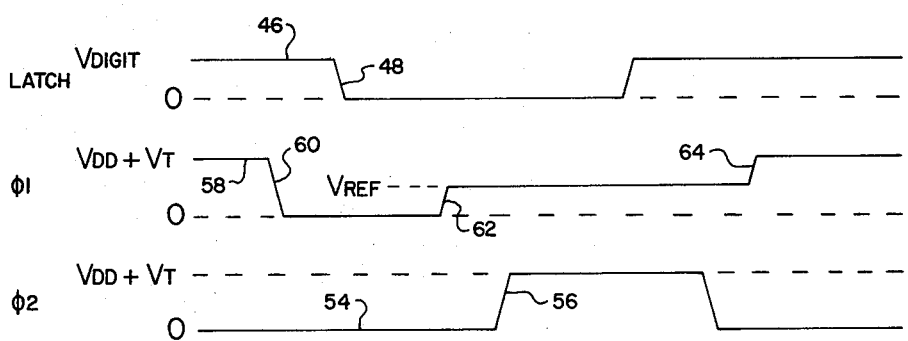
FIG. 3 is a timing diagram illustrating the operation of a slightly modified version of the FIG. 1 circuitry.

In the event that the precharge circuits 24 precharge the digit lines 12 and 14 to the full drain supply voltage, $V_{DD}$, or to the drain supply voltage less one threshold the transistors 38 and 39 may be eliminated from the refresh circuits 10 and 11 and proper operation can be achieved by modifying the Φ1 signal. This type of operation in the circuit will be described with respect to the timing diagram shown in FIG. 3. In FIG. 3, the LATCH signal indicated by the curve 46 and the Φ2 signal indicated by the curve 54 may be identical to the corresponding curves in FIG. 2. The Φ1 signal indicated by the curve 58 in FIG. 3 can be seen to be a composite of the PC and Φ1 signals shown in FIG. 2. In particular, curve 58 begins the cycle at a high level, preferably above the drain supply level by one threshold. At an event 60 corresponding to the event 44 in FIG. 2, the Φ1 signal drops to a ground potential. At an event 62 corresponding to the event 52 in FIG. 2, the Φ1 signal rises back to a reference potential which may be the same as that indicated in FIG. 2. At the end of the cycle, the curve 58 returns to a high potential level at the event 64.

Operation of circuits 10 and 11 without transistors 38 and 39 and according to the FIG. 3 timing diagram, begins during the precharge cycle produced by circuits 24 in FIG. 1. When the circuits 24 are holding the digit lines 12 and 14 at or near the $V_{DD}$ supply, the signal Φ1 turns on transistors 34 and 35 to precharge the gates 32 and 33 to the digit line precharge level. If the digit lines are precharged to the full $V_{DD}$ level, it is preferred that the Φ1 signal reach at least $V_{DD}$ plus one threshold. If the digit lines are precharged to only $V_{DD}$ less one threshold, the Φ1 signal need only reach the $V_{DD}$ supply level. At event 60 the Φ1 signal goes to ground isolating the precharge nodes 32 and 33. Operation after this time is essentially identical to the previously described operation. That is, at event 48 the latch signal goes to ground causing the sense amplifier 20 to detect the state of the memory cell attached to digit line 12 or 14. Following this the Φ1 signal returns to the reference potential level $V_{REF}$ causing transistor 34 or 35 to discharge node 32 or 33 according to the state of the digit lines 12 and 14 potentials. At the next point in the process, the Φ2 signal goes high at event 56 causing the bootstrapping of one of the precharge nodes 32 and 33 and turning on either transistor 26 or 27 to pull the corresponding digit line 12 or 14 to the full drain supply level, $V_{DD}$, or in some applications to $V_{DD}$ less one threshold.

In either case, the cycle ends by having the latch signal turned off, that is taken to the $V_{DIGIT}$ level, while the refresh circuit has latched the high digit line to the drain supply level. Following this for the FIG. 2 timing diagram, the Φ1 and Φ2 signals return to their low state and the precharge signal finally goes back to its high level in preparation for the next read cycle. In the FIG. 3 version, the 1 signal ends the cycle at a high level since it is also, in effect, the precharge signal.

While the present invention has thus far been described with respect to its use with a dynamic RAM, it is apparent that it may also be used with other types of dynamic circuitry. Thus, there are numerous other forms of dynamic MOS circuitry in which a voltage is established on a capacitive node and the node is allowed to float. Such capacitive nodes are in effect used to store the voltage originally established thereon and it is desirable that the storage be essentially permanent. As is well known, the charge on such capacitive nodes tends to bleed off so that an initial high potential established thereon slowly drops towards a ground potential. It can be seen that the active pull-up circuits 10 and 11 of FIG. 1 would be useful for refreshing any such capacitive nodes in a digital MOS circuit.

Figure 4:
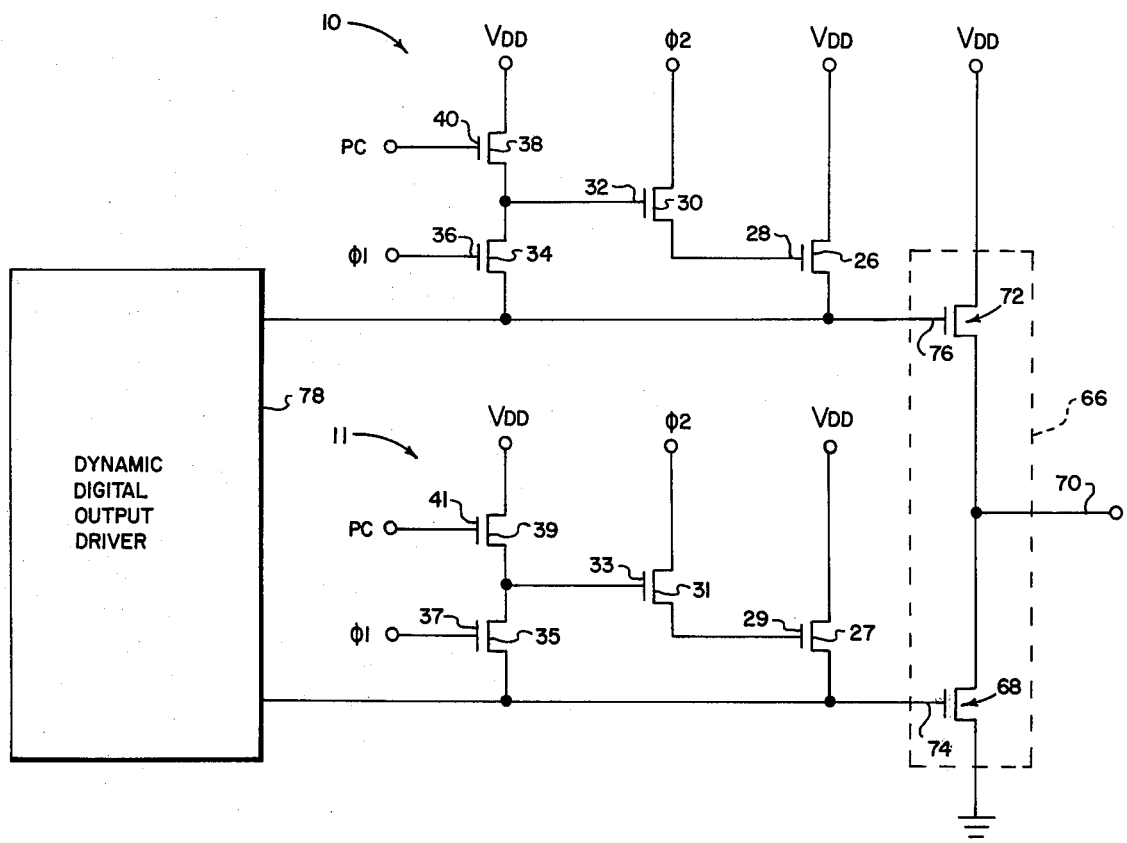
FIG. 4 is a block and schematic diagram of two active refresh circuits according to the present invention connected to a dynamic output stage of a MOS circuit.

With reference now to FIG. 4, there is provided another example of the use of active pull-up circuits 10 and 11 for refreshing capacitive storage nodes. In FIG. 4, there is shown a push-pull output stage 66, typically used to drive output pins of digital MOS circuitry. This output stage 66 includes a transistor 68 connected between an output 70 and ground potential and another transistor 72 connected between the output 70 and the positive supply, $V_{DD}$. Gates 74 and 76 of transistors 68 and 72 respectively are coupled to an output driver stage 78 which controls the states of transistor 68 and 72. In a truly dynamic MOS circuit, the output driver 78 typically establishes a potential near $V_{DD}$ on one of the gates 74 and 76 while grounding the other. Once the high potential is established on one of the gates 74, 76 the gates are allowed to float to thereby reduce power consumption within the output driver 78. It is generally desirable, once a particular state has been established on output 70, that that state remain until the output driver 78 changes the output level. Since there can be a considerable time period between normal changes of state in the output 70, the gate 74 or 76 which has been charged to a high level tends to loose charge and eventually drop below a minimum acceptable voltage representing a high logic state. This problem is avoided by connecting the active pull-up circuits 10 and 11 to the gates 76 and 74, respectively. As shown in FIG. 4, the circuits 10 and 11 are preferrably identical to the corresponding circuits shown in FIG. 1. In general, it will be necessary in this application that the transistors 38 and 39 be employed and that signals corresponding to the FIG. 2 timing diagram be provided to operate circuits 10 and 11.

To operate the circuits 10 and 11 in FIG. 4, the signals labelled PC, Φ1 and Φ2 of FIG. 2 are supplied as often as necessary to refresh the states on gate 74 and 76. While these clocked control signals would generally be provided with different names in a circuit other than the RAM of FIG. 1, they would still conform to the FIG. 2 timing diagram. In general, it would be important to prevent functioning of the refresh circuits 10 and 11 during the short time intervals in which the output driver 78 is establishing a new set of conditions on gate 74 and 76. Between the operations of the driver 78, clock signals are supplied to the circuits 10 and 11 at least often enough to avoid any significant loss of charge from the gate 74 or 76 which is charged to the high level. Quite often, the digital MOS circuitry includes an arrangement for repetitive refreshing of memory stages and it would be appropriate in such a case to trigger operation of the refresh circuits 10 and 11 during each such refresh cycle.

During each cycle of operation of circuits 10 and 11, the appropriate gate 74 or 76 which has previously been charged to a high level is refreshed to a level at or near the drain supply voltage. The circuits 10 and 11 operate in the same manner as described above to effectively detect whether the voltage on gate 74 and 76 is above or below the reference potential provided by the signal Φ1 and to refresh the signal which is above the reference level while allowing the voltage below the reference level to remain unchanged. It is apparent that the circuits 10 and 11 could likewise be applied to numerous other capacitive nodes employed in digital MOS circuitry.

While the present invention has been illustrated and described with respect to particular apparatus and methods of use, it is apparent that various modifications and changes can be made within the scope of the present invention as defined by the appended claims.

What is claimed is:

1. Circuitry for selectively refreshing a capacitive node to a high logic state as a function of a preestablished voltage level on that node comprising:
   a first transistor having a channel connected between a source of a drain supply voltage and said node, and a gate;
   a second transistor having a source connected to said first transistor gate, a drain, and a gate;
   a third transistor having a source connected to said node, a drain connected to said second transistor gate, and a gate; and
   control means for sequentially: precharging said second transistor gate to a first potential near said drain supply voltage; applying a reference potential to said third transistor gate, said reference potential being less than one threshold above a minimum voltage representing a high logic state; and, applying a second potential near said drain supply voltage to the drain of said second transistor.

2. Circuitry according to claim 1, wherein said first potential is above the level of said drain supply voltage less one threshold.

3. Circuitry according to claim 1, wherein said first potential is substantially equal to said drain supply voltage.

4. Circuitry according to claim 1, wherein said reference potential is greater than one threshold level above ground.

5. Circuitry according to claim 1, wherein said second potential is substantially equal to said drain supply voltage.

6. Circuitry according to claim 1, wherein said second potential exceeds said drain supply voltage.

7. Circuitry according to claim 1, wherein said second potential exceeds said drain supply voltage by at least one threshold.

8. Circuitry according to claim 1, wherein said control means for precharging said second transistor gate includes:
   a fourth transistor having a channel connected between said source of drain supply voltage and said second transistor gate, and a gate; and
   precharge control means for applying a third potential near said drain supply voltage to said fourth transistor gate.

9. Circuitry according to claim 8, wherein said third potential is substantially equal to said drain supply voltage.

10. Circuitry according to claim 8, wherein said third potential exceeds said drain supply voltage.

11. Circuitry according to claim 8, wherein said third potential exceeds said drain supply voltage by at least one threshold.

12. Circuitry for active refreshing of digit lines in a MOS dynamic random access memory comprising:
   a first transistor having a channel connected between a source of a drain supply voltage and a digit line, and a gate;
   a second transistor having a source connected to said first transistor gate, a drain, and a gate;
   a third transistor having a source connected to said digit line, a drain connected to said second transistor gate, and a gate; and
   control means for sequentially: precharging said second transistor gate to a first potential near said drain supply voltage; applying a reference potential to said third transistor gate after the state of a memory cell connected to said digit line has been read by a sense amplifier, said first reference potential being less than a digit line precharge voltage plus one threshold and applying a second potential near said drain supply voltage to the drain of said second transistor.

13. Circuitry according to claim 12, wherein said first potential is above the level of said drain supply voltage less one threshold.

14. Circuitry according to claim 12, wherein said first potential is substantially equal to said drain supply voltage.

15. Circuitry according to claim 12, wherein said reference potential is greater than one threshold level above ground.

16. Circuitry according to claim 12, wherein said second potential is substantially equal to said drain supply voltage.

17. Circuitry according to claim 12, wherein said second potential exceeds said drain supply voltage.

18. Circuitry according to claim 12, wherein said second potential exceeds said drain supply voltage by at least one threshold.

19. Circuitry according to claim 12, wherein said control means for precharging said second transistor gate includes:
   a fourth transistor having a channel connected between said source of drain supply voltage and said second transistor gate, and a gate; and
   precharge control means for applying a third potential near said drain supply voltage to said fourth transistor gate.

20. Circuitry according to claim 19, wherein said third potential is substantially equal to said drain supply voltage.

21. Circuitry according to claim 19, wherein said third potential exceeds said drain supply voltage.

22. Circuitry according to claim 19, wherein said third potential exceeds said drain supply voltage by at least one threshold.

23. Circuitry according to claim 12, wherein:
said memory includes digit line precharge means for precharging said digit line to said digit line precharge voltage; and
said control means for precharging said second transistor gate includes said third transistor and means for supplying a third potential near said drain supply voltage to said third transistor gate when said precharge means is precharging said digit line.

24. Circuitry according to claim 23, wherein said third potential exceeds said digit line precharge voltage by at least one threshold.

25. Circuitry according to claim 23, wherein said digit line precharge voltage is substantially equal to said drain supply voltage, and said third potential exceeds said drain supply voltage by at least one threshold.

26. Circuitry according to claim 23, wherein said digit line precharge voltage is substantially equal to said drain supply potential less one threshold and said third potential is substantially equal to said drain supply voltage.

27. A method of selectively refreshing a capacitive node to a high logic state as a function of a preestablished voltage level on that node comprising:
precharging the gate of a first transistor to a first potential near a drain supply voltage;
applying a reference potential no greater than one threshold above a minimum voltage representing a high logic state to the gate of a second transistor having a channel connected between the gate of said first transistor and said first node to selectively discharge said first transistor gate as a function of node potential;
applying a second potential near said drain supply voltage to the drain of said first transistor; and
connecting the source of said second transistor to the gate of a third transistor connected between a source of said drain supply voltage and said node.

28. A method according to claim 27, wherein said first potential is above the level of said drain supply voltage less one threshold.

29. A method according to claim 27, wherein said first potential is substantially equal to said drain supply voltage.

30. A method according to claim 27, wherein said reference potential is greater than one threshold level above ground.

31. A method according to claim 27, wherein said second potential is substantially equal to said drain supply voltage.

32. A method according to claim 27, wherein said second potential exceeds said drain supply voltage by one threshold.

33. A method according to claim 27, wherein precharging of said first transistor gate includes:
applying a third potential near said drain supply voltage to the gate of a fourth transistor connected between a supply of said drain voltage and said first transistor gate.

34. A method according to claim 33, wherein said third potential is substantially equal to said drain supply voltage.

35. A method according to claim 33, wherein said third potential is substantially equal to said drain supply voltage plus one threshold.

36. A method of actively refreshing a digit line in a MOSFET dynamic random access memory comprising:
precharging the gate of a first transistor to a first potential near a drain supply voltage;
after the state of a memory cell connected to said digit line has been sensed by a dynamic sense amplifier, applying a reference potential, less than a digit line precharge voltage plus one threshold, to the gate of a second transistor connected between the gate of said first transistor and said digit line to selectively discharge said first transistor gate as a function of digit line potential;
applying a second potential near said drain to the drain of said first transistor;
connecting the source of said second transistor to the gate of a third transistor connected between a source of said drain potential and said digit line.

37. A method according to claim 36, wherein said first potential is above the level of said drain supply voltage less one threshold.

38. A method according to claim 36, wherein said first potential is substantially equal to said drain supply voltage.

39. A method according to claim 36, wherein said reference potential is greater than one threshold level above ground.

40. A method according to claim 36, wherein said second potential is substantially equal to said drain supply voltage.

41. A method according to claim 36, wherein said second potential exceeds said drain supply voltage by one threshold.

42. A method according to claim 36, wherein said precharging of said first transistor gate includes the step of:
applying a third potential near said drain supply voltage to the gate of a fourth transistor connected between a supply of said drain voltage and said first transistor gate.

43. A method according to claim 42, wherein said third potential is substantially equal to said drain supply voltage.

44. A method according to claim 42, wherein said third potential is substantially equal to said drain supply voltage plus one threshold.

45. A method according to claim 36, wherein said memory includes means for precharging said digit line to said digit line precharge voltage and said precharging of said first transistor gate includes the step of:
during precharge of said digit line, applying a third potential near said drain supply voltage to the gate of said second transistor.

46. A method according to claim 45, wherein said third potential exceeds said digit line precharge voltage by at least one threshold.

47. A method according to claim 45, wherein said digit line precharge voltage is substantially equal to said drain supply voltage, and said third potential exceeds said drain supply voltage by at least one threshold.

48. A method according to claim 45, wherein said digit line precharge voltage is substantially equal to said drain supply potential less one threshold and said third potential is substantially equal to said drain supply voltage.

* * * * *